United States Patent
Miyachi et al.

(10) Patent No.: US 6,987,320 B2
(45) Date of Patent: Jan. 17, 2006

(54) PRESSURE-WELDED SEMICONDUCTOR DEVICE

(75) Inventors: Yukio Miyachi, Owariasahi (JP); Atsuto Okamoto, Nagoya (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 5 days.

(21) Appl. No.: 10/659,289

(22) Filed: Sep. 11, 2003

(65) Prior Publication Data

US 2004/0066610 A1    Apr. 8, 2004

(30) Foreign Application Priority Data

Sep. 12, 2002    (JP)    ............................. 2002-266940

(51) Int. Cl.
  *H01L 23/48*    (2006.01)
  *H01L 23/52*    (2006.01)
  *H01L 29/40*    (2006.01)

(52) U.S. Cl. .................................................. 257/746
(58) Field of Classification Search ...................... None
  See application file for complete search history.

(56) References Cited

U.S. PATENT DOCUMENTS

| | | | |
|---|---|---|---|
| 6,232,706 B1 | 5/2001 | Dai et al. | |
| 6,297,063 B1 * | 10/2001 | Brown et al. | 438/2 |
| 6,340,822 B1 * | 1/2002 | Brown et al. | 257/25 |
| 6,383,923 B1 * | 5/2002 | Brown et al. | 438/666 |
| 6,652,658 B1 * | 11/2003 | Mori et al. | 428/298.1 |
| 6,652,958 B2 * | 11/2003 | Tobita | 428/298.1 |
| 6,864,571 B2 * | 3/2005 | Arik et al. | 257/712 |

FOREIGN PATENT DOCUMENTS

| | | |
|---|---|---|
| JP | 2000-68297 | 3/2000 |
| JP | 2002-329723 | 11/2002 |
| WO | WO 02/26479 | 4/2002 |

OTHER PUBLICATIONS

P. G. Collins, et al., Science, www.sciencemag.org., vol. 292, pp. 706-709, "Engineering Carbon Nanotubes and Nanotube Circuits Using Electrical Breakdown", Apr. 27, 2001.

\* cited by examiner

*Primary Examiner*—David A. Zarneke
(74) *Attorney, Agent, or Firm*—Oblon, Spivak, McClelland, Maier & Neustadt, P.C.

(57)    ABSTRACT

In a pressure-welded semiconductor device where at least one semiconductor element is disposed inside a casing, a buffer conductive layer including conductive carbons is disposed at pressure-welded portions between first casing-side electrodes and element-side electrodes disposed on a first main surface and at pressure-welded portions between second casing-side electrodes and element-side electrodes disposed on a second main surface.

18 Claims, 6 Drawing Sheets

MANUFACTURING PROCESS OF TRENCH IGBT ELEMENT

PRESSURE-WELDED SEMICONDUCTOR DEVICE

CROSS-REFERENCE TO RELATED APPLICATION

This application claims priority under 35USC 119 from Japanese Patent Application No. 2002-266940, the disclosure of which is incorporated by reference herein.

BACKGROUND OF THE INVENTION

1. Field of the Invention

The present invention relates to a pressure-welded semiconductor device using a semiconductor element.

2. Description of the Related Art

A pressure-welded semiconductor device has a structure where at least one electrode disposed on each of two main surfaces of a semiconductor element (hereinafter abbreviated as "element-side electrodes"), such as an insulating gate bipolar transistor (hereinafter abbreviated as an "IGBT") or a MOS field-effect transistor (hereinafter abbreviated as a "MOSFET"), is pressurized by casing-side electrodes (hereinafter abbreviated as "casing-side electrodes") that contact the element-side electrodes. The reliability of this pressure-welded semiconductor device is high because solder is not used to connect the element-side electrodes and the casing-side electrodes.

The real contact area in the contact surfaces between the element-side electrodes and the casing-side electrodes is controlled by a pressurizing force. When the real contact area is small, electrical resistance between the element-side electrodes and the casing-side electrodes becomes large and diffusion of heat generated in the semiconductor element becomes difficult. In this case, the pressure-welded semiconductor device becomes unable to exhibit sufficient performance as a pressure-welded semiconductor device and reliability drops. For this reason, it is preferable for the pressurizing force to be as large as possible in order to enlarge the real contact area.

However, when the pressurizing force is increased, it is difficult to miniaturize and reduce the weight of the pressure-welded semiconductor device, and manufacturing costs also become high, because the configuration of pressurized portions for pressurization becomes large.

Japanese Patent Application Laid-Open Publication (JP-A) No. 2000-68297 proposes disposing a conductive nonwoven fabric such as Ni at the pressure-welded portions between the element-side electrodes (intermediate electrode plates) and the casing-side electrodes (common electrode plates). In this case, in comparison with the above-described conventional pressure-welded semiconductor, electrical resistance can be kept low and heat can be efficiently diffused, even with a relatively low pressurizing force, because variations in the height of the contact surfaces can be sufficiently absorbed.

However, because a conductive nonwoven fabric is used, electricity and heat are transmitted only at contact points between the fibers, and the spaces between the fibers do not function as good conductors of electricity and heat. Thus, for example, in a case where the conductive nonwoven fabric comprises a metal such as Ni, the electrical resistance and heat conductivity of the Ni nonwoven fabric drops even more than the original values of bulk Ni.

Thus, when the technology described in JP-A No. 2000-68297 is compared with the case where a bulk conductive substance is disposed between the element-side electrodes and the casing-side electrodes by metal solder connection or the like, it is inferior in terms of the drop in electrical resistance and improving thermal conductivity.

Additionally, in the case where a pressure-welded semiconductor device is assembled using a conductive nonwoven fabric, the conductive nonwoven fabric must be precisely disposed between the element-side electrodes and the casing-side electrodes. When the nonwoven fabric is disposed between the element-side electrodes and the casing-side electrodes in a state where positional displacement has occurred, there is the potential for other wiring inside the pressure-welded semiconductor element and electrodes to make contact. In this case, the pressure-welded semiconductor device becomes unable to exhibit its original performance as a pressure-welded semiconductor element, and cases where problems such as the device electrically short-circuiting are possible. This problem occurs not only when the conductive nonwoven fabric is positionally displaced, but there is also the potential for this problem to occur due to a drop in fibers of a long fiber length resulting from deterioration over time.

Moreover, because it becomes necessary to prevent positional displacement itself of the conductive nonwoven fabric at the time of manufacturing the pressure-welded semiconductor device, the assembly steps of the pressure-welded semiconductor device become more complicated and manufacturing costs also increase.

SUMMARY OF THE INVENTION

It is an object of the present invention to solve the above-described problem. That is, it is an object of the invention to provide a pressure-welded semiconductor device in which electrical resistance and thermal resistance at pressure-welded portions between element-side electrodes and casing-side electrodes are small, even when a pressurizing force applied to a semiconductor element is small.

It is also an object of the invention to provide a pressure-welded semiconductor device whose mechanical reliability is high and whose electrical conductivity and thermal conductivity are high.

The above-described objects are achieved by the following invention.

A first aspect of the invention is to provide a pressure-welded semiconductor device comprising:

at least one semiconductor element including a first main surface having disposed thereon at least one element-side electrode and a second main surface being opposite from the first main surface and having disposed thereon at least one element-side electrode;

a casing including a first casing plate and a second casing plate disposed so as to face each other, with a first casing-side electrode being disposed on an opposing surface of the first casing plate and a second casing-side electrode being disposed on an opposing surface of the second casing plate, the at least one semiconductor element being incorporated inside the casing so that the first casing-side electrode and the at least one element-side electrode disposed on the first main surface are pressure-welded and the second casing-side electrode and the at least one element-side electrode disposed on the second main surface are pressure-welded; and a buffer conductive layer including conductive carbons disposed at a pressure-welded portion between the first casing-side electrode and the element-side electrode disposed on the first main surface and at a pressure-welded portion between the second casing-side electrode and the element-side electrode disposed on the second main surface.

A second aspect of the invention is to provide the pressure-welded semiconductor device of the first aspect, wherein the conductive carbons are carbon nanotubes.

A third aspect of the invention is to provide the pressure-welded semiconductor device of the first or second aspect, wherein the conductive carbons are linear carbon structures and gaps therebetween are filled with a filler member.

DETAILED DESCRIPTION OF THE INVENTION

Figure 1:
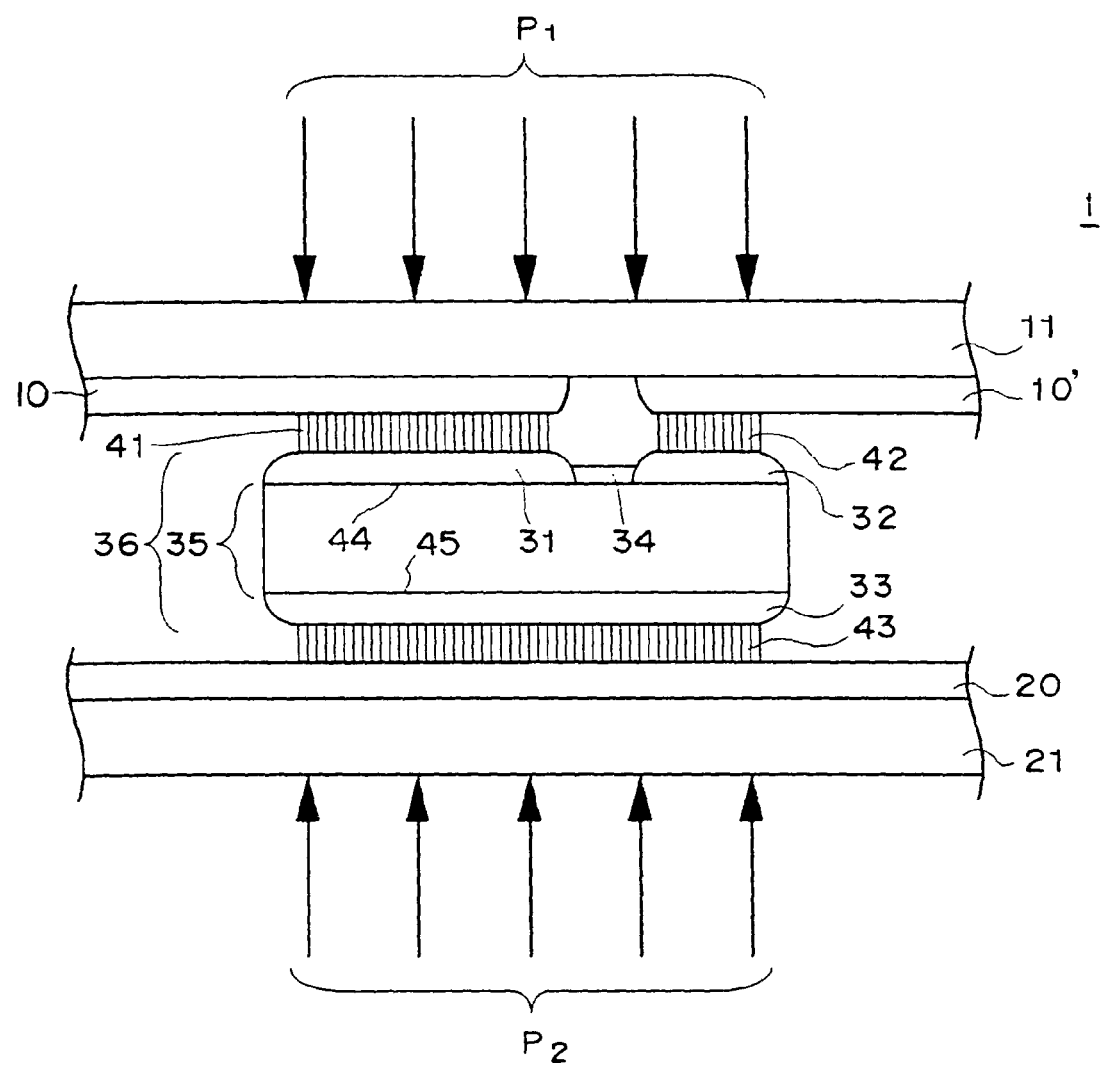
FIG. 1 is a schematic cross-sectional diagram showing a first example of the configuration of a pressure-welded semiconductor device of the invention.

Details of the invention will be described below in the order of a pressure-welded semiconductor device, the configuration of the pressure-welded semiconductor device and a method of manufacturing the pressure-welded semiconductor device. In the invention, "pressure-welded" may mean that casing-side electrodes and element-side electrodes are firmly fixed to each other, or that these electrodes are packed with pressure without being fixed to each other.

(Pressure-Welded Semiconductor Device)

The invention is characterized in that it is a pressure-welded semiconductor device comprising:

at least one semiconductor element including a first main surface having disposed thereon at least one element-side electrode and a second main surface being opposite from the first main surface and having disposed thereon at least one element-side electrode;

a casing including a first casing plate and a second casing plate disposed so as to face each other, with a first casing-side electrode being disposed on an opposing surface of the first casing plate and a second casing-side electrode being disposed on an opposing surface of the second casing plate, the at least one semiconductor element being incorporated inside the casing so that the first casing-side electrode and the at least one element-side electrode disposed on the first main surface are pressure-welded and the second casing-side electrode and the at least one element-side electrode disposed on the second main surface are pressure-welded; and a buffer conductive layer including conductive carbons disposed at a pressure-welded portion between the first casing-side electrode and the element-side electrode disposed on the first main surface and at a pressure-welded portion between the second casing-side electrode and the element-side electrode disposed on the second main surface.

The pressure-welded semiconductor device of the invention can reduce electrical resistance and thermal resistance at pressure-welded portions between the element-side electrode and the casing-side electrode, even when a pressurizing force applied to the semiconductor element is small.

For this reason, in the pressure-welded semiconductor device of the invention, because the configuration for pressurizing the semiconductor element can be miniaturized and simplified in comparison with a conventional pressure-welded semiconductor device, it is possible to simplify, miniaturize and reduce the weight of the structure of the pressure-welded semiconductor device, manufacturing costs can also be reduced, and reliability can also be improved.

The buffer conductive layers may have a single layer structure comprising one layer or may have a multilayer structure comprising two or more layers. Also, the buffer conductive layers may be film-like layers disposed so as to be tightly adhered to a surface of the element-side electrode or a surface of the casing-side electrode, may be sheet-like layers, or may be a combination of these.

Although the thickness of the buffer conductive layers is not particularly limited, it is preferably 100 nm or more, more preferably 1 µm or more, and particularly preferably 10 µm or more because it is necessary that the layers be sufficiently formed at the time they are pressurized so that the real contact area between the surfaces of the element-side electrode and the casing-side electrode becomes large. When the thickness is less than 100 nm, the buffer conductive layers cannot be sufficiently formed at the time they are pressurized, and it sometimes becomes difficult to reduce electrical resistance and thermal resistance even with a relatively low pressure.

It is good for the buffer conductive layers to be as thick as possible. Although there is no upper limit on the thickness of the buffer conductive layers, the thickness is preferably 2 mm or less and more preferably 1 mm or less from the practical standpoint of productivity, manufacturing costs and miniaturization of the pressure-welded semiconductor device.

The buffer conductive layers are not particularly limited as long as they include at least conductive carbons. The conductive carbons included in the buffer conductive layers are preferably 0.01 ppm or more and preferably 10% by mass or more, and it is most preferable for the buffer conductive layers to be substantially configured only by the conductive carbons.

The conductive carbons included in the buffer conductive layers are not particularly limited as long as they are publicly known conductive carbons. Examples thereof include carbon nanotubes, carbon fibers and carbon mircrofoils, and two or more kinds may be used in combination.

In the present invention, linear carbon structures are used as the conductive carbons. It is preferable to use carbon nanotubes as the linear carbon structures. When carbon nanotubes are not used, there are cases where it becomes difficult to reduce electrical resistance and thermal resistance at pressure-welded portions between the element-side electrode and the casing-side electrode with respect to the pressurizing force.

Anything can be used as the carbon nanotubes as long as they are publicly known carbon nanotubes that have conductivity. Examples include multiwalled carbon nanotubes (occasionally abbreviated as "MWCNTs" below), single-walled carbon nanotubes (occasionally abbreviated as "SWCNTs" below) displaying metallic properties, and carbon nanocoils where MWCNTs or SWCNTs are spirally wound. Two or more types of these can be used in combination.

When the buffer conductive layers include carbon nanotubes, it is preferable for the crystallinity of the carbon nanotubes to be high from the standpoint of the conductivity and thermal conductivity of the buffer conductive layers, and it is preferable for the carbon nanotubes to be oriented in a thickness direction of the buffer conductive layers. By "oriented" is meant at least substantially oriented.

It is preferable for the buffer conductive layers to be disposed so as to be tightly adhered to at least one of a surface of the element-side electrode disposed on the first main surface forming a pressure-welded portion with the first casing-side electrode and a surface of the element-side electrode disposed on the second main surface forming a pressure-welded portion with the second casing-side electrode.

When the buffer conductive layers are not disposed so as to be tightly adhered to the surfaces of these element-side electrodes, sometimes positional displacement of the buffer conductive layers disposed at the pressure-welded portions occurs and the buffer conductive layers fall out from the pressure-welded portions, whereby electrical resistance and thermal resistance increase, a short circuit or the like occurs between the opposing element-side electrode and the casing-side electrode and electrodes other than these, and conduction between the element-side electrode and the casing-side electrode becomes impossible.

In order to further reduce electrical resistance and thermal resistance with the same pressure, it is further preferable for the buffer conductive layers to be disposed so as to be tightly adhered to at least one of a surface of the first casing-side electrode and a surface of the second casing-side electrode.

When the buffer conductive layers are not disposed so as to be tightly adhered to the surface of the element-side electrode, they may be disposed so as to be tightly adhered to the surface of the casing-side electrode.

That is, it is preferable for the buffer conductive layers to be disposed so as to be tightly adhered to the surface of the first casing-side electrode and/or the surface of the second casing-side electrode.

When the buffer conductive layers are not disposed so as to be tightly adhered to the surfaces of these casing-side electrodes, sometimes positional displacement of the buffer conductive layers disposed at the pressure-welded portions occurs and the buffer conductive layers fall out from the pressure-welded portions, whereby electrical resistance and thermal resistance increase and conduction between the element-side electrode and the casing-side electrode becomes impossible.

In order to further reduce electrical resistance and thermal resistance with the same pressure, it is further preferable for the buffer conductive layers to be disposed so as to be tightly adhered to the surface of the first casing-side electrode and the surface of the second casing-side electrode.

Also, when the buffer conductive layers are linear carbon structures such as carbon nanotubes having electrical conductivity and thermal conductivity, they may be structures where both ends of the linear carbon structures are fixed at opposing electrodes. In this case, due to the fact that the conductive carbons have flexibility, the buffer conductive layers can have the same bufferability as a structure where one end or both ends are fixed at electrodes.

The main material configuring the element-side electrode is not particularly limited as long as it is a material having conductivity. However, when the buffer conductive layers are tightly adhered to and disposed on the surface of the element-side electrode as described already, it is preferable for at least a pressure-welded surface of the element-side electrode disposed on the first main surface and/or the second main surface to include a metal having a catalyst function which enables formation of a carbide.

When a metal having a catalyst function which enables formation of a carbide is not disposed on the pressure-welded surface of the element-side electrode, adhesion between the element-side electrode and the buffer conductive layer is not sufficiently obtained, and when films of columnar conductive carbons such as carbon nanotubes are formed by CVD (Chemical Vapor Deposition), sometimes the buffer conductive layers cannot be formed and the crystallization and orientation thereof become low.

Any metal can be used as the "metal having a catalyst function which enables formation of a carbide" as long as it is a publicly known metal having a catalyst function which enables formation of a carbide. Specific examples thereof include Fe, Ni, Co, Ti, Zr, Hf, Ca, Zr, Ce, Pr, Er, Si, Mo, V, Y, Rh, Pd, Pt, La, Nd, Gd, Tb, Dy, Ho and Lu. Two or more types of these may also be used in combination.

Moreover, of these metals having a catalyst function which enables formation of a carbide, it is preferable to use any one selected from Ni, Fe and Co or to use a combination of two or more types particularly from the standpoint of carbon nanotube formation.

The method by which the metal having a catalyst function which enables formation of a carbide is incorporated in at least the pressure-welded surface of the element-side electrode is not particularly limited, and a publicly known method can be used. For example, the element-side electrode itself may be configured by a metal having conductivity and having a catalyst function which enables formation of a carbide. Alternatively, the element-side electrode may also be configured by an alloy or a sintered compact including a metal having a catalyst function which enables formation of a carbide. A metal having a catalyst function which enables formation of a carbide may be implanted by ion implantation into a surface vicinity of the element-side electrode, or a thin film comprising a metal having a catalyst function which enables formation of a carbide may also be disposed on the surface of the element-side electrode using vapor deposition such as sputtering.

When the buffer conductive layers are tightly adhered to and disposed on the surface of the casing-side electrode as described already, similar to the case of the element-side electrode, it is preferable for at least a pressure-welded surface of the first casing-side electrode and/or the second casing-side electrode to include a metal having a catalyst function which enables formation of a carbide.

The pressure-welded semiconductor device of the invention is not particularly limited as long as it is a pressure-welded semiconductor device where at least one semiconductor element including a first main surface having disposed thereon at least one element-side electrode and a second main surface having disposed on a surface opposite from the first main surface at least one element-side electrode is incorporated inside a casing that includes a first casing plate and a second casing plate disposed so as to face each other, with a first casing-side electrode being disposed on an opposite surface of the first casing plate and a second casing-side electrode being disposed on an opposite surface of the second electrode plate, so that the first casing-side electrode and the at least one element-side electrode disposed on the first main surface are pressure-welded and the second casing-side electrode and the at least one element-side electrode disposed on the second main surface are pressure-welded, wherein a buffer conductive layer including conductive carbons is disposed at a pressure-welded portion between the first casing-side electrode and the element-side electrode disposed on the first main surface and at a pressure-welded portion between the second casing-side electrode and the element-side electrode disposed on the second main surface. The pressure-welded semiconductor device may also be one disposed with other constituent members and functions.

For example, bolts and nuts may also be attached as pressurizing means to the casing so that sufficient pressure is applied to the pressure-welded portions and so that this pressure can be stabilized and sustained. Also, cooling means such water-cooling blocks may also be disposed at outer portions of the casing in order for heat generated by the semiconductor element and transmitted to the first casing plate and the second casing plate to be efficiently diffused by the outer portions of the casing. Additionally, wiring may be connected as needed by solder or wire bonding to the first casing-side electrode and the second casing-side electrode in order to form an electrical circuit between the inside of the pressure-welded semiconductor device and the outside of the pressure-welded semiconductor device.

The first and second casing plates are not particularly limited as long as they include at least the function of preventing the first and second casing-side electrodes and the semiconductor device from electrically short-circuiting with the outer portion of the casing, configure the casing, and are configured by insulators or members including at least insulators.

Also, a publicly known semiconductor element such as an IGBT can be used as the semiconductor element as long as it has the above-described configuration.

(Configuration of the Pressure-Welded Semiconductor Device)

Next, the configuration of the pressure-welded semiconductor device of the invention will be specifically described. However, the configuration of the pressure-welded semiconductor device of the invention is not limited to the configurations of the following drawings.

FIG. 1 is a schematic cross-sectional diagram showing a first example of the pressure-welded semiconductor device of the invention, and shows a partial structure of the pressure-welded semiconductor device shown in a schematic cross-sectional diagram of a vicinity of one semiconductor element sandwiched between the first casing plate and the second casing plate.

In FIG. 1, 1 represents the pressure-welded semiconductor device, 10 and 10' represent the first casing-side electrodes, 11 represents the first casing plate, 20 represents the second casing-side electrode, 21 represents the second casing plate, 31 represents the first element-side electrode (emitter electrode), 32 represents the second element-side electrode (gate electrode), 33 represents the third element-side electrode (collector electrode), 34 represents the insulating layer, 35 represents a semiconductor element main section, 36 represents the semiconductor element, 41 represents the first buffer conductive layer, 42 represents the second buffer conductive layer, 43 represents the third conductive buffer layer, 44 represents the first main surface, and 45 represents the second main surface.

As shown in FIG. 1, the pressure-welded semiconductor device 1 is configured by the first casing-side electrodes 10 and 10', the first casing plate 11, the second casing-side electrode 20, the second casing plate 21, the first element-side electrode 31, the second element-side electrode 32, the third element-side electrode 33, the insulating layer 34, the semiconductor element main section 35, the semiconductor element 36, the first buffer conductive layer 41, the second buffer conductive layer 42 and the third buffer conductive layer 43. However, the pressure-welded semiconductor device 1 may also include other constituent members as needed.

The semiconductor element 36 is configured by the first element-side electrode 31, the second element-side electrode 32, the third element-side electrode 33, the insulating layer 34 and the semiconductor element main section 35. On the surface of the semiconductor element main section 35, the first element-side electrode 31 and the second element-side electrode 32 are disposed on the first surface 44 and the third element-side electrode 33 is disposed on the second main surface 45 opposite from and parallel to the first main surface 44. Also, in order to insulate the first element-side electrode 31 and the second element-side electrode 32, the insulating layer 34 is disposed between the first element-side electrode 31 and the second element-side electrode 32 on the surface of the semiconductor element main section 35. An unillustrated insulating layer is also disposed at the side of the first element-side electrode 31 opposite the side disposed with the insulating layer 34 and at the side of the second element-side electrode 32 opposite the side disposed with the insulating layer 34.

Also, the first element-side electrode 31, the second element-side electrode 32 and the third element-side electrode 33 are tightly adhered, so as to allow conduction, to the surface of the semiconductor element main section 35 or are tightly adhered, so as to not allow conduction, via a thin insulating layer to conductible portions disposed inside the semiconductor element main section 35.

The first casing plate 11 is disposed at the first main surface 44 side of the semiconductor element 36 and the second casing plate 21, which is parallel to the first casing plate 11, is disposed at the second main surface 45 side of the semiconductor element 36. Also, the first casing-side electrode 10 and the other first casing-side electrode 10' are disposed, so that conduction is not possible therebetween, at the first main surface 44 side of the first casing plate 11, and the second casing-side electrode 20 is disposed at the second main surface 45 side of the second casing plate 21. The first casing-side electrode 10 is disposed on the first casing plate 11 so as to be pressure-weldable to the first element-side electrode 31, and the first casing-side electrode 10' is disposed on the first casing plate 11 so as to be pressure-weldable to the second element-side electrode 32.

The first buffer conductive layer 41 is disposed at a first pressure-welded portion (space) between the first casing-side electrode 10 and the first element-side electrode 31, the second buffer conductive layer 42 is disposed at a second pressure-welded portion (space) between the first casing-side electrode 10' and the second element-side electrode 32, and the third buffer conductive layer 43 is disposed at a third pressure-welded portion (space) between the second casing-side electrode 20 and the third element-side electrode 33.

Pressure is evenly applied in the direction of arrows $P_1$ by unillustrated pressurizing means to the surface of the first casing plate 11 opposite from the side disposed with the semiconductor device 36, and pressure is evenly applied in the direction of arrows $P_2$ by unillustrated pressurizing means to the surface of the second casing plate 21 opposite from the side disposed with the semiconductor device 36, so that pressure is applied to the first to third pressure-welded portions.

Thus, conduction is possible between the semiconductor element 36 and the first casing-side electrodes 10 and 10' and between the semiconductor element 36 and the second casing-side electrode 20, and it is possible to efficiently diffuse heat generated in the semiconductor element 36 to the outside of the semiconductor element 36.

Because the first buffer conductive layer 41, the second buffer conductive layer 42 and the third buffer conductive layer 43 comprise a buffer conductive layer including conductive carbons used in the invention, electrical resistance and thermal resistance in the first to third pressure-welded portions can be reduced even if the pressure (sum of pressure $P_1$ and pressure $P_2$) applied to the semiconductor element 36 is small.

It should be noted that, although the buffer conductive layer is disposed at all of the first to third pressure-welded portions in the pressure-welded semiconductor device 1 shown in FIG. 1, the invention is not limited thereto. It suffices as long as the buffer conductive layer is disposed at at least any one pressure-welded portion of the first pressure-welded portion, the second pressure-welded portion and the third pressure-welded portion. An example of this pressure-welded semiconductor device will be described below with reference to FIG. 2.

Figure 2:
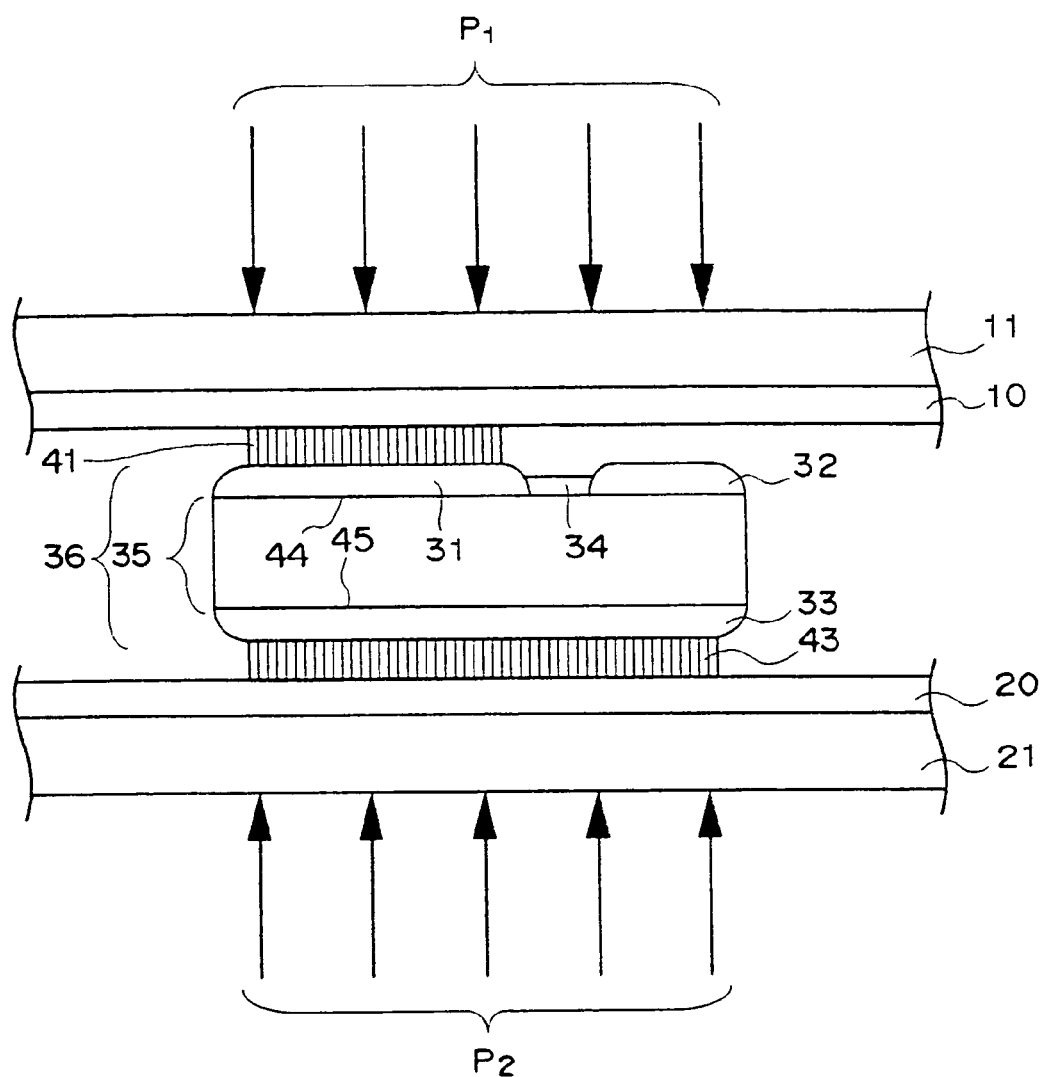
FIG. 2 is a schematic cross-sectional diagram showing a second example of the configuration of the pressure-welded semiconductor device of the invention.

FIG. 2 is a schematic cross-sectional diagram showing a second example of the pressure-welded semiconductor device of the invention, and shows a configuration in a case where the second element-side electrode 32 and the first casing-side electrode 10 are not connected by not disposing the second buffer conductive layer 42 at the second pressure-welded portion and where the second element-side electrode 32 is connected to a portion other than the first casing-side electrode 10 via unillustrated wiring.

In FIG. 2, 2 represents the pressure-welded semiconductor device, and portions represented by reference numerals and signs shared in common with those of FIG. 1 represent substantially the same portions shown in FIG. 1.

In the pressure-welded semiconductor device 2 shown in FIG. 2, because the first buffer conductive layer 41 is disposed at the first pressure-welded portion and the third buffer conductive layer 43 is disposed at the third pressure-welded portion, conduction is possible between the semiconductor element 36 and the first casing-side electrode 10 and between the semiconductor element 36 and the second casing-side electrode 20, and it is possible to efficiently diffuse heat generated in the semiconductor element 36 to the outside of the semiconductor element 36.

It should be noted that, although the surface of the second element-side electrode 32 is connected to unillustrated wiring by wire bonding or the like, unillustrated wiring may also be directly connected to the portion of the surface of the semiconductor element main section 35 disposed with the second element-side electrode 32, without disposing the second element-side electrode 32.

The pressure-welded semiconductor device of the invention may also include other constituent members in addition to those of the configurations described in FIGS. 1 and 2.

For example, wiring may also be connected as needed by wire bonding or the like to the surfaces of the first casing-side electrodes 10 and 10' and the second casing-side electrode 20. Also, cooling members for more effectively diffusing heat generated by the semiconductor element 36 may also be disposed on the surface of the first casing plate 11 opposite from the side disposed with the semiconductor element 36 and on the surface of the second casing plate 21 opposite from the side disposed with the semiconductor element 36. Moreover, in order to apply pressure to the semiconductor element 36, bolts and nuts may be used to fix the first casing plate 11 and the second casing plate 21 so that pressure is applied in the directions in which the first casing plate 11 and the second casing plate 21 approach each other.

A pressure-welded semiconductor device disposed with such cooling members and pressurizing means comprising bolts and nuts will be described using FIG. 3.

Figure 3:
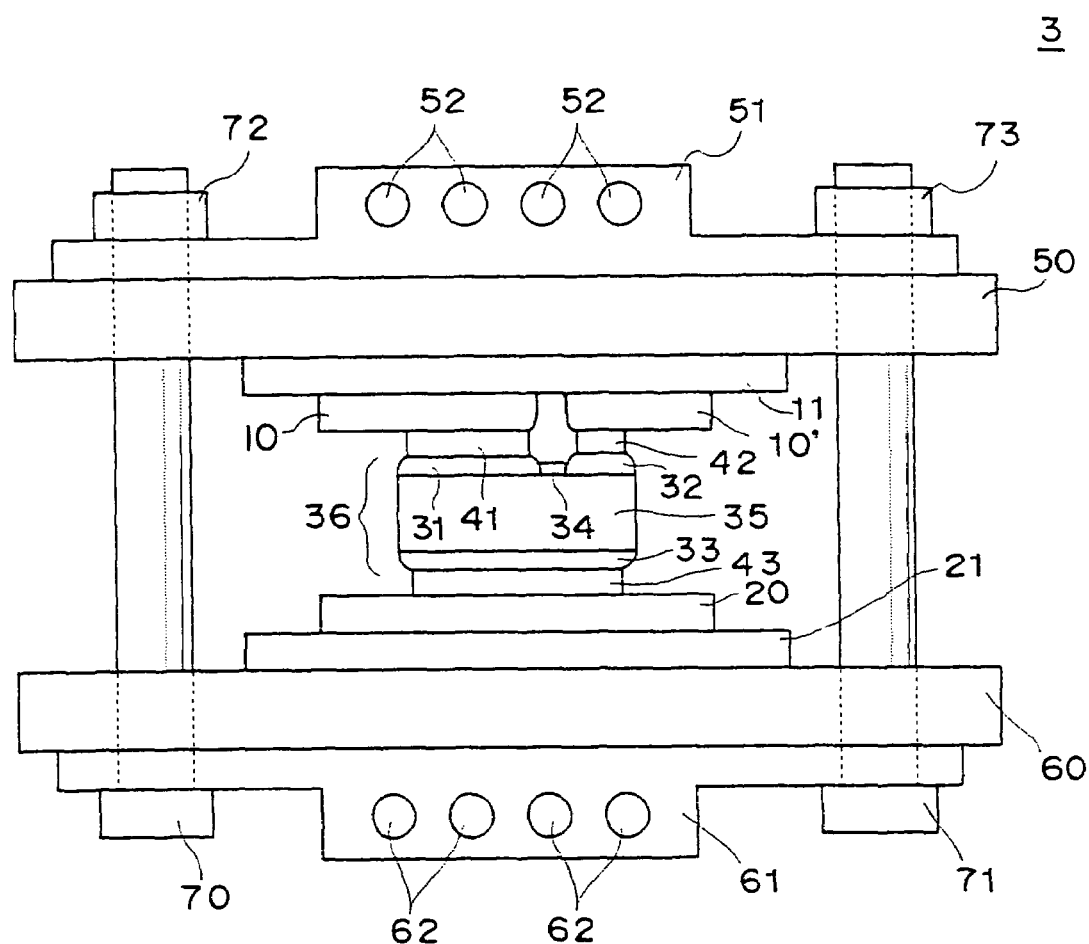
FIG. 3 is a schematic cross-sectional diagram showing a third example of the configuration of the pressure-welded semiconductor device of the invention.

FIG. 3 is a schematic cross-sectional diagram showing a third example of the configuration of the pressure-welded semiconductor device of the invention, and shows a pressure-welded semiconductor device having a configuration disposed with cooling members and pressurizing means comprising bolts and nuts in addition to the configuration of the pressure-welded semiconductor device of FIG. 1.

In FIG. 3, portions represented by reference numerals shared in common with those of FIG. 1 and the relative positional relation of these portions are the same as the case shown in FIG. 1. Also, in FIG. 3, 3 represents the pressure-welded semiconductor device, 50 represents a first cooling plate, 51 represents a first water-cooling block, 52 represents liquid flow paths, 60 represents a second cooling plate, 61 represents a second water-cooling block, 62 represents liquid flow paths, 70 and 71 represent bolts, and 72 and 73 represent nuts.

In addition to the portions represented by reference numerals 10, 10', 11, 20, 21, 31, 32, 33, 34, 35, 41, 42 and 43, which portions have the same configurations as those in FIG. 1, the pressure-welded semiconductor device 3 is configured by the first cooling plate 50, the first water-cooling block 51, the second cooling plate 60, the second water-cooling block 61, the bolt 70, the bolt 71, the nut 72 and the nut 73.

The first cooling plate 50 is disposed on the surface of the first casing plate 11 opposite from the side disposed with the semiconductor element 36, and the second cooling plate 60 is disposed on the surface of the second casing plate 21 opposite from the side disposed with the semiconductor element 36. Also, the first water-cooling block 51 is disposed on the surface of the first cooling plate 50 opposite from the side disposed with the semiconductor element 36, and the second water-cooling block 61 is disposed on the surface of the second cooling plate 60 opposite from the side disposed with the semiconductor element 36.

The liquid flow paths 52 for channeling cooling water are disposed in the first water-cooling block 51, and the liquid flow paths 62 for channeling cooling water are disposed in the second water-cooling block 61. The liquid flow paths 52 and the liquid flow paths 62 are connected to an unillustrated cooling water supply disposed outside the pressure-welded semiconductor device 3. It is possible for the cooling water to circulate between the cooling water supply and the liquid flow paths 52 and 62.

Thus, heat that is generated by the semiconductor element 36 and transmitted to the first water-cooling block 51 and the second water-cooling block 62 is efficiently diffused to the outside of the pressure-welded semiconductor device 3 by the cooling water flowing in the liquid flow paths 52 and 62.

Also, the bolt 70 and the bolt 71 are inserted into two screw holes represented by dotted lines disposed in a plate-thickness direction of the first cooling plate 50, the first water-cooling block 51, the second cooling plate 60 and the second water-cooling block 61 so that ends of the bolts 70 and 71 are passed through the second water-cooling block 61 and successively penetrate the second cooling plate 60, the first cooling plate 50 and the first water-cooling block 51, so that a force is applied where the first cooling plate 50 and the first water-cooling block 51 and the second cooling plate 60 and the second water-cooling block 61 press against the semiconductor element 36. End portions of the bolts 70 and 71 sticking out from the surface of the first water-cooling block 51 opposite from the side disposed with the semiconductor element 36 are respectively fastened with the nuts 72 and 73.

Thus, a good and stable conduction of electricity and heat can be secured between the first casing-side electrode 10 and the first element-side electrode 31 pressure-welded with the buffer conductive layer 41 sandwiched therebetween, and between the first casing-side electrode 10' and the second element-side electrode 32 pressure-welded with the buffer conductive layer 42 sandwiched therebetween, and also between the second casing-side electrode 20 and the third element-side electrode 33 pressure-welded with the buffer conductive layer 43 sandwiched therebetween.

It should be noted that a publicly known insulator such as AlN can be used for the first casing plate 11 and the second casing plate 21 in order to prevent an electrical short-circuit with the outside of the pressure-welded semiconductor device 3 of the second casing-side electrode 20 contacting the second casing plate 21 and the first casing-side electrodes 10 and 10' contacting the first casing plate 11.

Also, the first cooling plate 50 and the second cooling plate 60 are not particularly limited as long as they are plates comprising a material having high thermal conductivity that can efficiently transmit, in the direction of the outside of the pressure-welded semiconductor device 3, heat generated by the semiconductor element 36. For example, a CuMo alloy or the like can be used.

Next, an embodiment where gaps between linear carbon structures are filled with a filler member in a case where the conductive carbons used in the buffer conductive layers are linear carbon structures will be described with reference to FIGS. 6A and 6B.

Figure 6A:
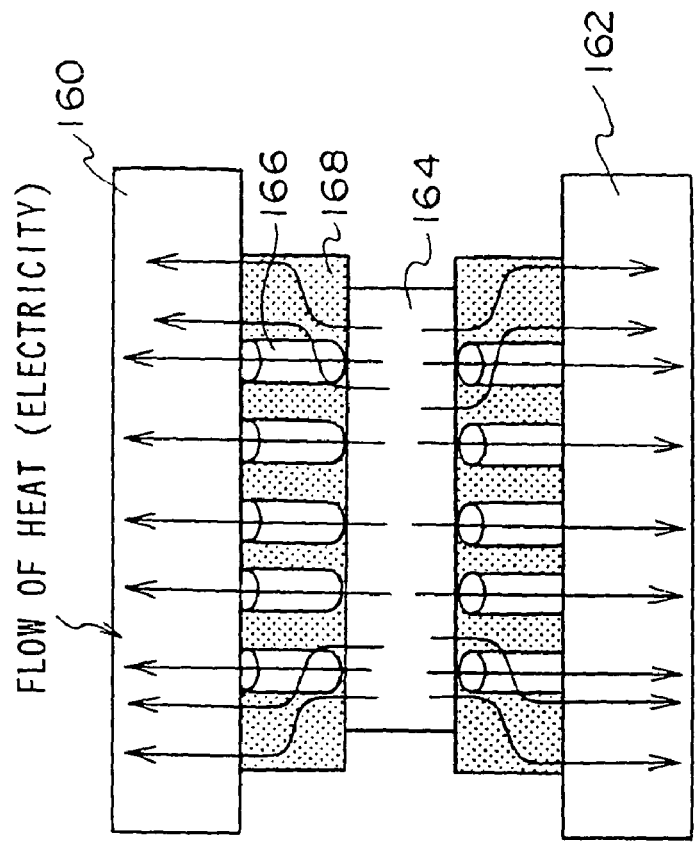
FIGS. 6A and 6B are schematic cross-sectional diagrams of the pressure-welded semiconductor device of an embodiment where gaps between linear carbon structures are filled with a filler member and an embodiment where they are not filled.

FIG. 6A is a schematic cross-sectional diagram of a pressure-welded semiconductor device using the above-described linear carbon structures such as carbon nanotubes. 160 represents the first casing plate, 162 represents the second casing plate, 164 represents the semiconductor element, and 166 represents the linear carbon structures such as carbon nanotubes. The electrodes are not shown.

Figure 6B:
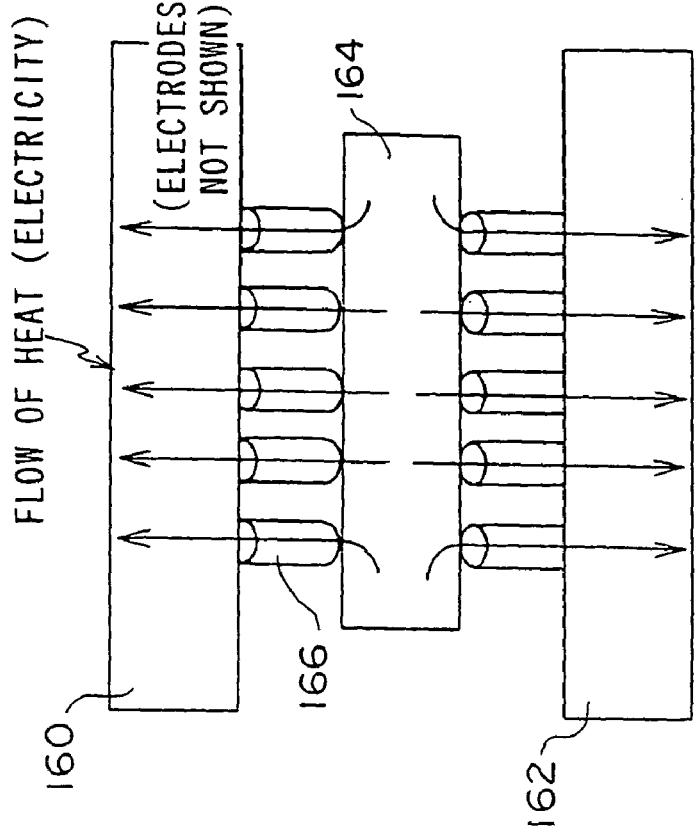

FIG. 6B is a schematic cross-sectional diagram of a pressure-welded semiconductor device of the embodiment where gaps between the linear carbon structures are filled with a filler member. 160, 162, 164 and 166 are the same as in FIG. 6A, and 168 represents the filler member. Similar to FIG. 6A, the electrodes are not shown.

The filler member is not particularly limited and examples thereof include metals, ceramics and organic materials (resin).

Due to the fact that the gaps between the linear carbon structures are filed with the filler member, the independence of the linear carbon structures with respect to the electrodes is aided and the linear carbon structures can be prevented from bending or becoming detached with respect to the pressure at the time of pressure-welding. Also, electrical and thermal conductivity is improved in both the vertical and horizontal directions, and cooling capability can be raised. Moreover, by strengthening the buffer conductive layers, handling with respect to static electricity and external forces at the time the module is assembled becomes easy and yield can be improved.

Also, the invention may also be of an embodiment where the gaps between the linear carbon structures are filled with a filler member and both ends of the linear carbon structures are not fixed at the electrodes. In this embodiment, the structures have independent film structures at least during the manufacturing process.

Also, at least one end portion of each linear carbon structure such as carbon nanotubes may be carbidized and bonded to the electrodes. By carbidizing the end portions, electrical conductivity and thermal conductivity that are high in comparison to a case where the end portions simply contact the electrodes can be obtained.

Thus, simplification, miniaturization and weight reduction of the module structure, and also a reduction in manufacturing costs, can be realized.

(Method of Manufacturing the Pressure-Welded Semiconductor Device)

The method of manufacturing the pressure-welded semiconductor device described above is not particularly limited, and it is possible to manufacture the device by combining and using publicly known techniques. However, particularly in relation to the formation of the buffer conductive layers, it is preferable to manufacture the device with the method described below. The method will be described below on the assumption that the buffer conductive layers are disposed so as to be tightly adhered to the element-side electrodes.

Method of Forming the Buffer Conductive Layers

The method of disposing the buffer conductive layers so that they are tightly adhered to the surfaces of the element-side electrodes is not particularly limited as long as it is a publicly known method. Broadly divided, the following two methods can be used. That is, these are (1) a method using vapor phase deposition and (2) a method using a paste including conductive carbons, and will be described in this order below.

(1) Method Using Vapor Phase Deposition

In the case using vapor phase deposition, desired conductive carbons are formed on the surfaces of the element-side electrodes by selecting various types of vapor phase deposition methods used and the film forming conditions thereof, and conductive carbon precursors are formed on the surfaces of the element-side electrodes. Thereafter, the conductive carbons are deposited on the surfaces of the element-side electrodes by thermally decomposing the conductive carbon precursors, whereby the buffer conductive layers can be formed on the surfaces of the element-side electrodes.

In the case using vapor phase deposition, regions of the semiconductor element not disposed with the buffer conductive layers of the surfaces on which the element-side electrodes are disposed can be covered in advance with a resist pattern or a metal mask in order to avoid an electrical short-circuit due to the films including the conductive carbons being formed on portions other than the surfaces of the element-side electrodes on which the buffer conductive layers are to be formed.

The vapor phase deposition method for forming the conductive carbons and the precursors of the conductive carbons is not particularly limited as long as it is a publicly known method, and can be selected in accordance with the desired conductive carbons.

The method will be specifically described using, as an example, a case where the conductive carbons are carbon nanotubes. When buffer conductive layers including carbon nanotubes are formed, the layers can be directly formed by CVD.

Of these methods of forming the buffer conductive layers using vapor phase deposition, it is preferable to directly form the buffer conductive layers including carbon nanotubes particularly by thermal CVD or microwave CVD from the standpoints of securing and improving the orientation of the carbon nanotubes in the thickness direction of the buffer conductive layers and suppressing adverse thermal effects on the semiconductor element at the time the buffer conductive layers are formed.

An example of the method of forming the carbon nanotubes using thermal CVD is the method disclosed by K. Mukhopadhyay et al (*Jpn. J. Appl. Phys.* 37 (1998) L1257). When this method is used, acetylene is used as a source gas and synthesis of a MWCNT whose relative crystallinity is excellent is possible at a temperature of about 600° C.

Although it has been necessary to synthesize an SWCNT at a high temperature of 800° C. or higher, as already described in JP-A No. 2002-255519, it is also possible to synthesize an SWCNT at a temperature of approximately 550° C. using ethanol or methanol as a source gas in the method disclosed by S. Murayama et al (*Chem. Phys. Lett.* 360 (2002) 229).

Thus, by using the above described methods, a desired SWCNT or MWCNT can be formed on the surfaces of the element-side electrodes at a temperature of around 600° C. or therebelow.

The source gas used in CVD is not particularly limited as long as it is a gas that includes at least one kind or more of a gas including carbon. For example, saturated hydrocarbons such as methane ($CH_4$) and ethane ($C_2H_6$), unsaturated hydrocarbons such as ethylene ($C_2H_4$) and acetylene ($C_2H_2$), aromatic hydrocarbons such as benzene ($C_6H_6$), alcohols such as ethanol and methanol, or carbon monoxide (CO) or carbon dioxide ($CO_2$) can be used. In addition to these, an inert gas such as nitrogen ($N_2$) or a noble gas such as argon (Ar) can be used as the carrier gas of the above-listed source gases.

(2) Method Using a Paste Including Conductive Carbons

In the case using a paste that includes conductive carbons, the buffer conductive layers can be formed by coating the paste on the surfaces of the element-side electrodes where the buffer conductive layers are to be formed.

The paste may be coated using screen printing or coated after regions of the semiconductor element not disposed with the buffer conductive layers of the surfaces on which the element-side electrodes are disposed are covered in advance with a metal mask. This is to avoid an electrical short-circuit due to the films including the conductive carbons being formed on portions other than the surfaces of the element-side electrodes on which the buffer conductive layers are to be formed.

The paste is not particularly limited as long as it is a paste that includes conductive carbons and resin. It is possible to select, as needed, the type and mixing amount of the conductive carbons and resin used and other additional components.

Relation between Manufacture of Semiconductor Element and Formation of Buffer Conductive Layers When the pressure-welded semiconductor device of the invention is manufactured, the buffer conductive layers can be disposed on the element-side electrodes of the semiconductor element by the above-described methods using a semiconductor element manufactured through plural steps by a set method.

However, the manufacturing steps and the manufacturing method of the semiconductor element may be changed if necessary as long as they are within a range that does not compromise the semiconductor element's functions as a semiconductor element. For example, a step of forming the buffer conductive layers may be inserted in the middle of the manufacturing steps of the semiconductor element. It is also possible to change, when necessary, the configuration of the semiconductor element and the materials used.

This case will be specifically described below using, as an example, a case where the semiconductor element is a trench IGBT element.

Figure 4:
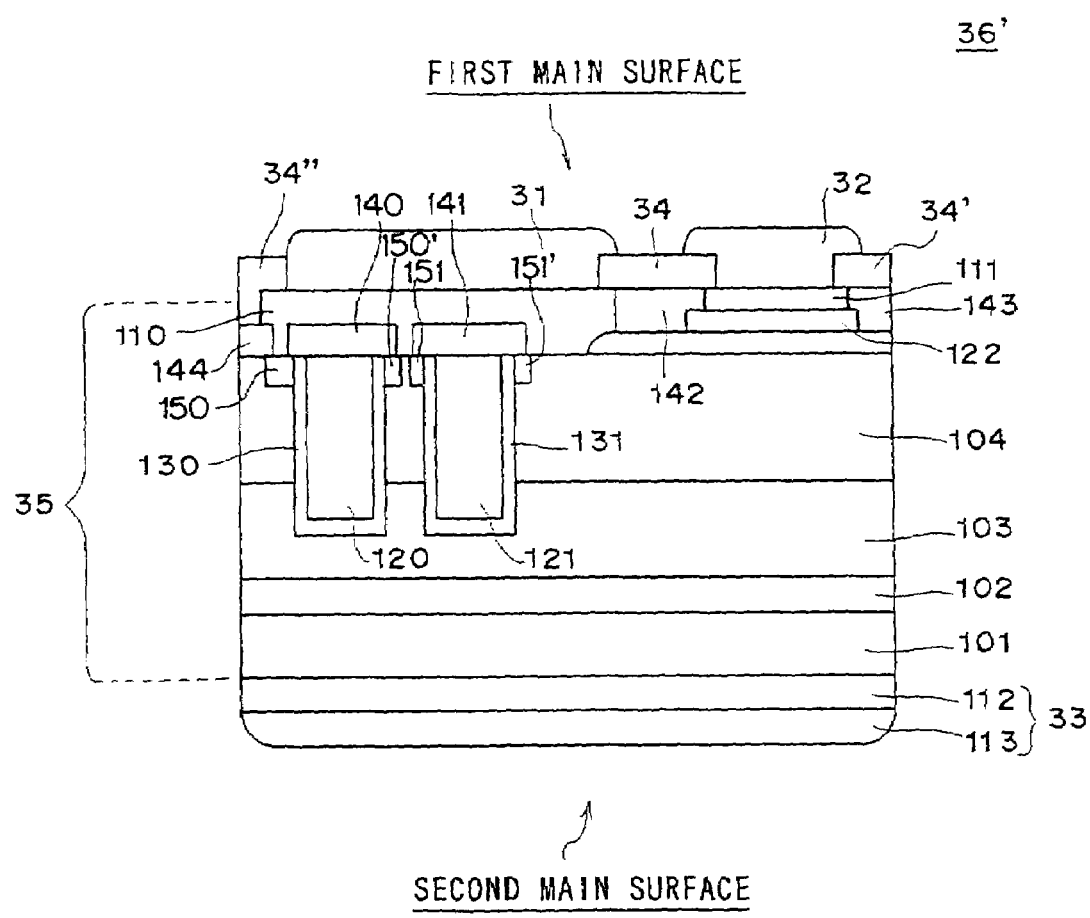
FIG. 4 is a schematic cross-sectional diagram of a semiconductor element (trench IGBT element)

FIG. 4 shows a schematic cross-sectional diagram of the semiconductor element (trench IGBT element). Similar to the semiconductor element 36 shown in FIG. 1, this is a semiconductor element (trench IGBT element) having a structure where the first element-side electrode 31 and the second element-side electrode 32 are disposed on the first main surface and the third element-side electrode 33 is disposed on the second main surface.

<Configuration of Semiconductor Element (Trench IGBT Element)>

In FIG. 4, portions represented by reference numerals shared in common with those of FIG. 1 and the relative positional relation of these portions are the same as the case shown in FIG. 1.

Also, in FIG. 4, 34' and 34" represent insulating layers, 36' represents the semiconductor element (trench IGBT element), 101 represents a p-collector layer, 102 represents an n-buffer layer, 103 represents an n-epitaxial layer, 104 represents a p-base layer, 110 represents a first Al layer, 111 represents a second Al layer, 112 represents a third Al layer, 113 represents an Ni layer, 120 represents a first gate wiring, 121 represents a second gate wiring, 122 represents a third gate wiring, 130 represents a first gate oxidation layer, 131 represents a second gate oxidation layer, 140 represents a first interlayer insulating film, 141 represents a second interlayer insulating film, 142 represents a third interlayer insulating film, 143 represents a fourth interlayer insulating film, 144 represents a fifth interlayer insulating film, and 150, 150', 151 and 151' represent emitter layers.

The semiconductor element 36' is configured by the semiconductor element main section 35, the third element-side electrode 33 configured by a metal layer of the two layers of the third Al layer 112 and the Ni layer 113 laminated in this order on the second main surface of the semiconductor element main section 35, and the first element-side electrode 31, the second element-side electrode 32, and the insulating layer 34, the insulating layer 34' and the insulating layer 34" respectively disposed on the first main surface of the semiconductor element main section 35.

The insulating layer 34' is disposed at the side of the second element-side electrode 32 opposite from the side disposed with the insulating layer 34 in order to prevent an electrical short-circuit of the second electrode layer 32, and the insulating layer 34" is disposed at the side of the first element-side electrode 31 opposite from the side disposed with the insulating layer 34 in order to prevent an electrical short-circuit of the first electrode layer 31.

The semiconductor element main section 35 has a layered configuration where, from the second main surface side to the first main surface side, the p-collector layer 101, the n-buffer layer 102, the n-epitaxial layer 103, the p-base layer 104 and the first Al layer 110 are successively formed.

Also, the first gate wiring 120 and the second gate wiring 121 are disposed so as to reach a center vicinity of the n-epitaxial layer 103 from the interface between the first Al layer 110 and the p-base layer 104.

The first gate oxidation film 130 is disposed at a second main surface-side surface of the first gate wiring 120 and at surfaces of the first gate wiring 120 vertically intersecting the first main surface so as to insulate the first gate wiring 120 from the p-base layer 104 and the n-epitaxial layer 103. The second gate oxidation film 131 is disposed at a second main surface-side surface of the second gate wiring 121 and at surfaces of the second gate wiring 121 vertically intersecting the first main surface so as to insulate the second gate wiring 121 from the p-base layer 104 and the n-epitaxial layer 103.

Also, the first interlayer insulating film 140 is disposed at the first main surface-side of the first gate wiring 120 in order to insulate the first gate wiring 120 from the first Al layer 110, and the second interlayer insulating film 141 is disposed at the first main surface-side of the second gate wiring 121 in order to insulate the second gate wiring 121 from the first Al layer 110.

Moreover, the emitter layer 150 is disposed at the first Al layer 110 side within the p-base layer 104 so as to contact the fifth interlayer insulating film 144, the first Al layer 110, the first interlayer insulating film 140 and the first gate insulating film 130. The emitter layer 150' is disposed at the side of the first gate wiring 120 opposite from the side disposed with the emitter layer 150, so as to contact the first Al layer 110, the first interlayer insulating film 140 and the first gate insulating film 130. Virtually similarly, the emitter layer 151 is disposed at the first Al layer 110 side within the p-base layer 104 so as to contact the first Al layer 110, the second interlayer insulating film 141 and the second gate insulating film 131. The emitter layer 151' is disposed at the side of the second gate wiring 121 opposite from the side disposed with the emitter layer 151, so as to contact the first Al layer 110, the second interlayer insulating film 141 and the second gate insulating film 131.

The emitter electrode (first element-side electrode) 31 is disposed on the first main surface-side of the first Al layer 110 at a first main surface-side direction upper vicinity disposed with the first gate wiring 120 and the second gate wiring 121. Also, the fifth interlayer insulating film 144 is disposed between the interlayer insulating film 34'' and the p-base layer 104 so as to make contact with these, the first Al layer 110 and the emitter layer 150.

The layer disposed so as to contact the second main surface-side of the gate electrode (second element-side electrode) 32 comprises a layer where the first Al layer 110 is replaced with the second Al layer 111 and the third gate wiring 122, and the third gate wiring 122 and the second Al layer 111 are laminated from the second main surface-side of the gate electrode 32 to the first main surface-side.

The third gate wiring 122 is wire-bonded, by unillustrated wiring, to the first gate wiring 120 and the second gate wiring 121 in a depth direction of the semiconductor element 36', controls the electric potential of these gate wirings and conducts switching.

Also, the third interlayer insulating film 142 is disposed on the first Al layer 110 side surface of two layers comprising the second Al layer 111 and the third gate wiring 122 so as to also contact the second main surface-side of the insulating film 34. The fourth interlayer insulating film 143 is disposed on the surface of the side of these two layers opposite from the side disposed with the third interlayer insulating film 142 so as to also contact the second main surface-side of the insulating film 34'.

<Manufacture of the Semiconductor Element (Trench IGBT Element)>

Figure 5:
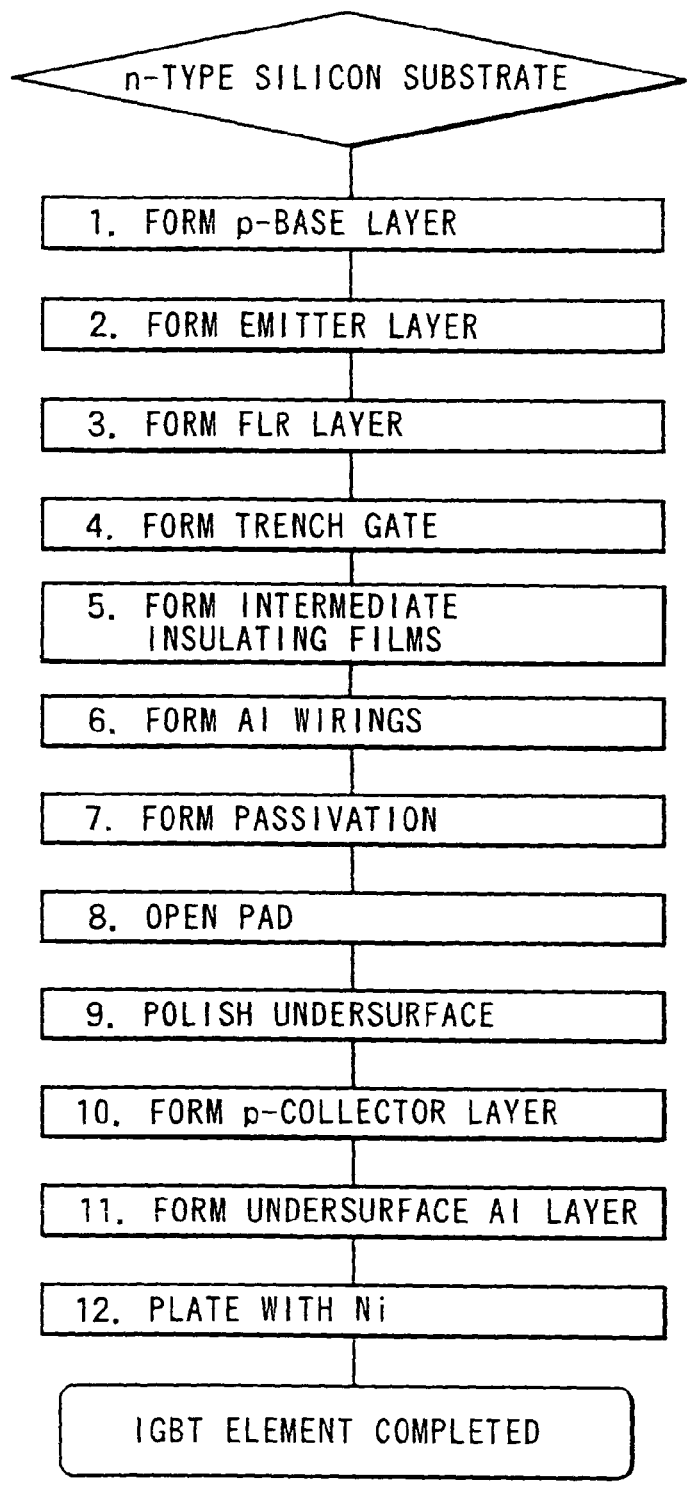
FIG. 5 is a flow chart showing the outline of a manufacturing process of the semiconductor element shown in FIG. 4.

Next, the manufacturing process of the semiconductor element 36' described above will be described. FIG. 5 is a flow chart showing the outline of the manufacturing process of the semiconductor element shown in FIG. 4. As shown in FIG. 5, the semiconductor element 36' is manufactured through steps (1) to (12) (steps represented by the numbers enclosed in circles in FIG. 5). The manufacturing process of the semiconductor element 36' will be described in order in correspondence to the twelve steps shown in FIG. 5.

It should be noted that, although the description of the manufacturing process does not always precisely correspond to the configuration of the semiconductor element 36' shown in FIG. 4, for convenience of explanation, description will be given while referring to the respective parts of the semiconductor element 36' shown in FIG. 4.

(1) P-Base Layer Formation, (2) Emitter Layer Formation and (3) FLR Layer Formation First, by conducting photolithography, ion implantation and heat diffusion with respect to the first main surface-side of an n-type silicon substrate (portion corresponding to reference numerals 101, 102, 103 and 104 in FIG. 4), the p-base layer 104, the emitter layer (portion corresponding to reference numerals 50, 150', 151 and 151' in FIG. 4) and the FLR (pressure-withstanding structure FLR (Field Limiting Ring); plural striped P-type layers (not shown) and the like disposed in parallel in a plate thickness direction of the n-type silicon substrate in a region close to the outer surface (surface vertically intersecting the first main surface and the second main surface) of the p-base layer 104, at the first main surface-side (upper surface) of the p-base layer 104) were formed.

(4) Trench Gate Formation

Next, the first gate wiring 120 and the second gate wiring 121 were formed in the following order with the purpose of controlling switching. First, two grooves for disposing the first gate wiring 120 and the second gate wiring 121 from the first main surface side were disposed using RIE (Reactive Ion Etching) until they reached the n-epitaxial layer 103.

Next, the first gate oxidation film 120 and the second gate oxidation film 121 were formed on the second main surface-side of these two grooves and the surface vertically intersecting the second main surface. Thereafter, polysilicon was formed so as to fill the insides of these two grooves by CVD, whereby the first gate wiring 120 and the second gate wiring 121 were formed.

(5) Formation of Interlayer Insulating Films

At this time, with respect to the polysilicon formed on the substrate surface (surface of the p-base layer 104), the first main surface-sides of the first gate wiring 120 and the second gate wiring 121 and the substrate surface other than vicinities thereof, the wiring portions comprising the polysilicon disposed in the substrate surface direction and the portion corresponding to the third gate wiring 122 were masked with resists by photolithography and removed by etching by RIE or CDE (Chemical Dry Etching), to form a wiring portion (not shown) and the third gate wiring 122 on the substrate surface.

Thereafter, a silicon oxide film was formed on the etched substrate surface in order to prevent electrical contact with other portions. Then, window-opening was conducted by photolithography and RIE, and the first interlayer insulating film 140, the second interlayer insulating film 141, the third interlayer insulating film 143 and the fourth interlayer insulating film 144 were disposed on the first main surface-side surfaces of the first gate wiring 120 and the second gate wiring 121.

(6) Formation of Al Wiring

In this manner, after the first gate wiring 120 and the second gate wiring 121 were formed as described above on the substrate surface so as to be filled in the substrate, and the third gate wiring 122, the first interlayer insulating film 140, the second interlayer insulating film 141, the third interlayer insulating film 143 and the fourth interlayer insulating film 144 were disposed on the substrate surface, the Al layers were formed by sputtering. Next, unnecessary portions were removed by photolithographing and etching the Al layers to thereby form the first Al layer 110 and the second Al layer 111.

(7) Passivation Formation and (8) Pad Opening

Thereafter, an insulating layer (passivation) comprising silicon oxide was disposed by plasma CVD on the substrate surface (mainly, the surfaces formed by the first Al layer 110 and the second Al layer 111). Moreover, the insulating layer covering the surface of the first Al layer 110 and the surface of the second Al layer 111 was removed by photolithography and RIE in order for the emitter electrode 31 and the gate electrode 32 to be disposed, and two grooves (pads) for disposing the emitter electrode 31 and the gate electrode 32 were formed.

(9) Surface Polishing, (10) P-Collector Layer Formation and (11) Undersurface Al Layer Formation Next, the undersurface (corresponding to the second main surface-side surface of the p-collector layer 101 in FIG. 4) of the substrate was polished by a method such as lapping, and the p-collector layer 101 was formed from the polished surface to the first main surface direction. The formation of the p-collector layer 101 was conducted by implanting, in the surface vicinity of the polished surface, dopant ions such as boron which form a p-type semiconductor, and then annealing in a furnace in the range of 400° C. to 1100° C.

It should be noted that, as the annealing method, it is also possible to use an RTP (Rapid Thermal Process) using an infrared lamp annealing device or a heat treatment using an excimer laser.

Thereafter, the third Al layer 112 was formed by sputtering and vapor deposition as an undersurface electrode on the surface of the p-collector layer 101 formed as described above.

(12) Ni Plating

Because contaminants adhere and oxide films are formed in the above-described series of manufacturing processes, the surface of the first Al layer 110 and the surface of the second Al layer 111 disposed so as to be exposed at the first main surface-side of the substrate manufactured as described above and the surface of the third Al layer 112 disposed on the second main surface-side of the substrate were etched with sulfuric acid or phosphoric acid with the purpose of removing these contaminants and oxide films.

The surface of the first Al layer 110, the surface of the second Al layer 111 and the surface of the third Al layer 112 that were etched by sulfuric acid or phosphoric acid were zincate-treated by immersing the surfaces in a strong alkali solution including zinc, and then electroless nickel plating was conducted by immersing the surfaces in a plating solution comprising nickel nitrate, lactic acid and sodium hypophosphate.

In this manner, by forming the emitter electrode 31 on the surface of the first Al layer 110, forming the gate electrode 32 on the surface of the second Al layer 111, and forming the Ni layer 113 on the surface of the third Al layer 112, the collector electrode (third element-side electrode) comprising these two layers was formed and the semiconductor element 36' was obtained.

Using the semiconductor element 36' manufactured in this manner through steps (1) to (12), it is of course possible to manufacture a pressure-welded semiconductor device according to a publicly known method. However, the pressure-welded semiconductor device of the invention can be manufactured by disposing, so as to be tightly adhered to all or one of any of the surface of the emitter electrode 31, the surface of the gate electrode 32 and the surface of the collector electrode 33, buffer conductive layers including conductive carbons such as carbon nanotubes.

When the pressure-welded semiconductor device of the invention is to be manufactured, the manufacturing steps and manufacturing method of the semiconductor element 36', and the configuration of the semiconductor element and the materials used, can be changed as needed as long as they are within a range that does not compromise the function of the semiconductor element as the semiconductor element 36'.

The same is true when the pressure-welded semiconductor device is manufactured using a semiconductor element other than the semiconductor element 36'.

For example, in a case where films of carbon nanotubes are disposed as buffer conductive layers by CVD on the surface of the emitter electrode 31, the surface of the gate electrode 32 and the surface of the collector electrode 33, a pressure-welded semiconductor device having the configuration shown in FIG. 1 can be manufactured using the semiconductor device 36' manufactured through steps (1) to (12) as it is.

Also, in a case where films of carbon nanotubes are disposed as buffer conductive layers by CVD on only the surface of the emitter electrode 31 and the surface of the collector electrode 33, a method such as described below can be adopted.

For example, before forming the films of carbon nanotubes, the surface of the gate electrode 32 of the semiconductor element 36' manufactured through steps (1) to (12) can be protected in advance with a resist using photolithography. Thus, buffer conductive layers comprising carbon nanotubes can be disposed only on the surface of the emitter electrode 31 and the surface of the collector electrode 33. Alternatively, the surface of the gate electrode 32 may be blocked off by a metal mask at the time of forming the films of carbon nanotubes, so that the carbon nanotubes are not formed on the surface of the gate electrode 32.

During the manufacturing steps of the semiconductor device 36', the surface of the Al layer 111 can also be protected in advance with a resist using photolithography before conducting nickel plating. Thereafter, by conducting nickel plating and stripping off the resist, a semiconductor device 36' can be obtained where the gate electrode 32 comprising Ni is not formed and where the surface of the second Al layer 111 is exposed. When the films of carbon nanotubes are formed using the semiconductor device 36' where the surface of the second Al layer 111 is exposed, the buffer conductive layers comprising the carbon nanotubes can be formed only on the surface of the emitter electrode 31 and the surface of the collector electrode 33 without the carbon nanotube film being formed tightly adhering to the surface of Al layer 111.

Thus, as described above, by using the semiconductor device 36' where the buffer conductive layers comprising carbon nanotubes are disposed only on the surface of the emitter electrode 31 and the surface of the collector electrode 33, a pressure-welded semiconductor device having the configuration shown in FIG. 2 can be manufactured. It should be noted that wiring can be connected by wire bonding to the surface of the gate electrode 32 on which a carbon nanotube film was not formed or to the surface of the second Al layer 111 exposed without forming the gate electrode 32.

The method of forming the buffer conductive layers comprising the carbon nanotube films or the like only on one or two specific element-side electrodes of the three element-side electrodes can be similarly applied to a case where wiring is only connected to the gate electrode 32 or a position corresponding to the gate electrode 32 and to the case of the emitter electrode 31 and the collector electrode 33.

The manufacturing method of the pressure-welded semiconductor device where the gaps between the linear carbon structures are filled with a filler member will be described below.

(Example of Filling with a Metal)

A wafer in which a film of carbon nanotubes is formed is immersed in diluted sulfuric acid, the nickel oxide film on the nickel electrode is removed and the metal nickel is exposed. The wafer is immersed in a plating solution comprising nickel sulfate, lactic acid and sodium hypophosphate, electroless nickel plating is conducted, Ni is allowed to grow, and the gaps between the carbon nanotubes are filled.

(Example of Filling with a Ceramic)

A wafer in which a film of carbon nanotubes is formed is immersed in diluted sulfuric acid, the nickel oxide film on the nickel electrode is removed and the metal nickel is exposed. The wafer is placed in a chamber and heated, trimethyl aluminum is introduced into the chamber as an aluminum material, nitrogen is introduced into the chamber as a gas nitride, CVD is conducted, aluminum nitride is allowed to grow from the electrode, and the gaps between the carbon nanotubes are filled.

(Example of Filling with an Organic Material)

After polyimide is spin-coated onto a wafer and the gaps between the carbon nanotubes are filled, calcination is conducted, the solvent is evaporated, and the polyimide is solidified and fixed on the wafer.

(Example of Carbidizing after Filling with a Metal (1))

Filling with the metal is conducted as described above (example of filling with a metal).

In a case where a catalytic metal remains on the base portions of the carbon nanotubes, when the ends of the carbon nanotubes project out from the filled metal, a film of metal where the formation of carbide is easy such as titanium is formed on opposing electrodes, the opposing electrodes are brought into contact with the ends of the carbon nanotubes, titanium carbide or the like is formed by heating, and the opposing electrodes are bonded to the carbon nanotubes.

(Example of Carbidizing after Filling with a Metal (2))

Filling with the metal is conducted as described above (example of filling with a metal).

In a case where a catalytic metal remains on the base portions of the carbon nanotubes, when the ends of the carbon nanotubes are buried in the filled metal, the inside of the filled metal is polished (scraped). At this time, sometimes the ends of the carbon nanotubes are also cut. A film of metal where the formation of carbide is easy such as titanium is formed on opposing electrodes, the opposing electrodes are brought into contact with the ends of the carbon nanotubes, titanium carbide or the like is formed by heating, and the opposing electrodes are bonded to the carbon nanotubes. In the case of the present example, since sometimes the ends of the carbon nanotubes are also cut, carbidization can be done easily due to the fact that active carbons are exposed.

(Manufacture of a Self-Standing Film where the Carbon Nanotubes are Dispersed)

By polishing the wafer of the above example of filling with a metal from the undersurface (silicon) side, all of the silicon portion could be scraped off so that only a metal surface remained, and a self-standing film where the carbon nanotubes were oriented in the vertical direction in the metal was manufactured. After this self-standing film was sandwiched between the electrodes, it can be carbidized with the electrode metals heated in the same manner as in the above example of carbidizing after filling with a metal (2), and can be fixed to the electrodes.

EXAMPLES

The invention will be more specifically described below by way of examples. However, the scope of the invention is not limited to the following examples.

Outline of Examples

The pressure-welded semiconductor devices of the examples and the comparative example were manufactured by manufacturing pressure-welded semiconductor devices where the configuration of the pressure-welded portions between the electrodes disposed at the semiconductor element side and the electrodes disposed at the casing side was changed. The electrical resistance and thermal resistance of these pressure-welded semiconductor devices were evaluated with respect to pressure applied between the element-side electrodes and the casing-side electrode.

Also, as the semiconductor elements used in the manufacture of the pressure-welded semiconductor devices of the examples and the comparative example, semiconductor elements having the same configuration as that of the semiconductor element (trench IGBT element) 36' shown in FIG. 4 and having equal electrical properties and heat properties were used. Buffer electrode layers including carbon nanotubes were disposed as needed on the surfaces of the element-side electrodes of the trench IGBT element.

Example 1

For the pressure-welded semiconductor device of Example 1, the semiconductor element 36' shown in FIG. 4 manufactured by the above-described procedure was used to manufacture a pressure-welded semiconductor device where the pressure-welded portions between the semiconductor element and the casing had the configuration shown in FIG. 1.

The formation of the buffer conductive layers and the manufacture of the pressure-welded semiconductor device were conducted by the procedures described below.

Formation of the Buffer Conductive Layers

The semiconductor element 36' was immersed for 10 seconds in an aqueous solution of sulfuric acid (10% by weight) in order to remove oxides from the surface of the emitter electrode 31 and the surfaces of the gate electrode 32 and the collector electrode 33. After the immersed semiconductor element 36' was sufficiently rinsed and dried, the semiconductor element 36' was placed in a reactor of an in-house manufactured CVD machine and air was discharged from the inside of the reactor with a vacuum pump, whereby the back pressure became 1.33 Pa (0.01 Torr) or less, and unnecessary gas components such as moisture were evaporated and cleaned.

Thereafter, 850 sccm of Ar gas was introduced so that the pressure became about 1 atmosphere (101.34 kPa) inside the reactor, and prebaking was conducted at 400° C. for 30 minutes. Next, a mixed gas of Ar and $C_2H_2$ (Ar flow rate: 850 sccm; $C_2H_2$ flow rate: 10 sccm) was introduced, heating was conducted at 600° C. for 15 minutes, and the first buffer conductive layer 41, the second buffer conductive layer 42 and the third buffer conductive layer 43 comprising the carbon nanotubes were respectively formed on the surfaces of the emitter electrode 31, the gate electrode 32 and the collector electrode 33.

When the three buffer conductive layers formed in this manner were observed with a scanning electron microscope (SEM), the film thickness of all of the buffer conductive layers was 10 μm, and it was confirmed that the carbon nanotubes were oriented in a direction substantially parallel to the film thickness direction of the emitter electrode 31, the gate electrode 32 and the collector electrode 33 and that the carbon nanotubes were densely formed. Also, almost all of the diameters of the carbon nanotubes were 100 nm or less and the lengths thereof were about 10 μm on average.

Manufacture of the Pressure-Welded Semiconductor Device

Next, the semiconductor element 36' where the buffer conductive layers comprising the carbon nanotubes had been formed on the surfaces of the three element-side electrodes was sandwiched between two mounting substrates where an electrode (thickness: 0.4 mm) comprising Al was disposed as the casing-side electrode on one side of an AlN sintered plate (height: about 30 mm; width: 20 mm; thickness: 1 mm), so that the element-side electrodes and the casing-side electrode came into contact. Moreover, the surfaces of the two mounting substrates opposite from the sides at which the casing-side electrode was disposed were sandwiched between two cooling plates (made of CuMo) having high thermal conductivity, and the semiconductor element was pressurized. Cooling blocks were attached to the surfaces of the cooling plates opposite from the sides at which the semiconductor element 36' was disposed and were fixed with bolts and nuts so as to apply pressure to the semiconductor element 36', whereby the pressure-welded semiconductor device of Example 1 (hereinafter abbreviated as "the pressure-welded semiconductor device A") was obtained. The pressure-welded semiconductor device A has the same configuration as that of the pressure-welded semiconductor device 3 shown in FIG. 3.

The contact resistance and thermal resistance of the obtained pressure-welded semiconductor device A were evaluated while changing the pressure applied to the semiconductor element 36'. As a result, the electrical resistance and the thermal resistance both dropped in accompaniment with an increase in the pressure, and contact resistance and thermal resistance that were sufficient for practical use were shown when the pressure was 90 kPa or higher (load of 1 kg or more).

Example 2

For the pressure-welded semiconductor device of Example 2, the semiconductor element 36' shown in FIG. 4 manufactured by the above-described procedure was used to manufacture a pressure-welded semiconductor device where the pressure-welded portions between the semiconductor element and the casing had the configuration shown in FIG. 2.

The formation of the buffer conductive layers and the manufacture of the pressure-welded semiconductor device were conducted by the procedures described below.

Formation of the Buffer Conductive Layers

Using the semiconductor element 36' where the surface of the gate electrode 32 was protected in advance with a resist, the semiconductor element 36' was immersed for 10 seconds in an aqueous solution of sulfuric acid (10% by weight) in order to remove oxides from the surface of the emitter electrode 31 and the surfaces of the gate electrode 32 and the collector electrode 33. After the immersed semiconductor element 36' was sufficiently rinsed and dried, the semiconductor element 36' was placed in a reactor of an in-house manufactured CVD machine and air was discharged from the inside of the reactor with a vacuum pump, whereby the back pressure became 1.33 Pa (0.01 Torr) or less, and unnecessary gas components such as moisture were evaporated and cleaned.

Thereafter, 850 sccm of Ar gas was introduced so that the pressure became about 1 atmosphere (101.34 kPa) inside the reactor, and prebaking was conducted at 300° C. for 30 minutes. Next, while the pressure inside the reactor was held at 1 atmosphere (101.34 kPa), 10 sccm of $C_2H_2$ gas was introduced, heating was conducted at 600° C. for 15 minutes, and the first buffer conductive layer 41 and the third buffer conductive layer 43 comprising the carbon nanotubes were respectively formed on the surfaces of the emitter electrode 31 and the collector electrode 33. Thereafter, the resist film that had protected the surface of the gate electrode 32 was stripped off.

When the two buffer conductive layers formed in this manner were observed with a scanning electron microscope (SEM), the film thickness of both of the buffer conductive layers was 100 μm, and it was confirmed that the carbon nanotubes were oriented in a direction generally parallel to the film thickness direction of the emitter electrode 31 and the collector electrode 33 and that the carbon nanotubes were densely formed. Also, almost all of the diameters of the carbon nanotubes were 100 nm or less and the lengths thereof were about 10 μm on average.

Manufacture of the Pressure-Welded Semiconductor Device

Next, the semiconductor element 36' where the buffer conductive layers comprising the carbon nanotubes had been formed on the surfaces of the two element-side electrodes was sandwiched between two mounting substrates where an electrode (thickness: 0.4 mm) comprising Al was disposed as the casing-side electrode on one side of an AlN sintered plate (height: about 30 mm; width: 20 mm; thickness: 1 mm), so that the element-side electrodes and the casing-side electrode came into contact. Moreover, the surfaces of the two mounting substrates opposite from the sides at which the casing-side electrode was disposed were sandwiched between two cooling plates (made of CuMo) having high thermal conductivity, and the semiconductor element was pressurized. Cooling blocks were attached to the surfaces of the cooling plates opposite from the sides at which the semiconductor element 36' was disposed and were fixed with bolts and nuts so as to apply pressure to the semiconductor element 36', whereby the pressure-welded semiconductor device of Example 2 (hereinafter abbreviated as "the pressure-welded semiconductor device B") was obtained.

The pressure-welded semiconductor device B has the same configuration as that of the pressure-welded semiconductor device 3 shown in FIG. 3 except that the second buffer conductive layer 42 was not disposed.

The contact resistance and thermal resistance of the obtained pressure-welded semiconductor device B were evaluated while changing the pressure applied to the semiconductor element 36'. As a result, the electrical resistance and the thermal resistance both dropped in accompaniment with an increase in the pressure, and contact resistance and thermal resistance that were sufficient for practical use were shown when the pressure was 90 kPa or higher (load of 1 kg or more).

Comparative Example 1

The pressure-welded semiconductor device of Comparative Example 1 (hereinafter abbreviated as "the pressure-welded semiconductor device C") was obtained by manufacturing a pressure-welded semiconductor device in the same manner as in Example 1 except that the three buffer conductive layers were not formed. The obtained pressure-welded semiconductor device of Comparative Example 1 was evaluated in the same manner as in Example 1.

As a result, although the electrical resistance and the thermal resistance both dropped in accompaniment with an increase in the pressure, when the pressure-welded semiconductor device C was compared with the pressure-welded semiconductor device A of Example 1 having the same configuration with the exception that the buffer conductive layers were not disposed, the electrical resistance and the thermal resistance in the pressure-welded semiconductor device C were larger than those in the pressure-welded semiconductor device A with respect to both pressure values.

Moreover, contact resistance and thermal resistance sufficient for practical use could not be obtained when the pressure was 90 kPa (load of 1 kg). That is, when the pressure-welded semiconductor device C was compared with the pressure-welded semiconductor device A of Example 1, it was understood that contact resistance and thermal resistance sufficient for practical use could not be obtained with the pressure-welded semiconductor device C unless a larger pressure was applied.

Example 3

For the pressure-welded semiconductor device of Example 3, the semiconductor element 36' shown in FIG. 4 manufactured by the above-described procedure was used to manufacture a pressure-welded semiconductor device where the pressure-welded portions between the semiconductor element and the casing had the configuration shown in FIG. 1.

Formation of the Buffer Conductive Layers

The buffer conductive layers were manufactured in the same manner as the above Example 1.

Filling of the Carbon Nanotube Gaps with Metal

A wafer in which a film of carbon nanotubes was formed was immersed in diluted sulfuric acid, the nickel oxide films on the emitter electrode 31, the gate electrode 32 and the collector electrode 33, which were nickel electrodes, were removed and the metal nickel was exposed. Next, the wafer was immersed in a plating solution including nickel sulfate, lactic acid and sodium hypophosphate, and electroless nickel plating was conducted. Ni grew on the emitter electrode 31, the gate electrode 32 and the collector electrode 33, and the gaps in the carbon nanotubes on the electrodes were filled.

Manufacture of the Pressure-Welded Semiconductor Device

Next, the semiconductor element 36' where the buffer conductive layers comprising the carbon nanotubes had been formed on the surfaces of the three element-side electrodes was sandwiched between two mounting substrates where an electrode (thickness: 0.4 mm) comprising Al was disposed as the casing-side electrode on one side of an AlN sintered plate (height: about 30 mm; width: 20 mm; thickness: 1 mm), so that the element-side electrodes and the casing-side electrode came into contact. Moreover, the surfaces of the two mounting substrates opposite from the sides at which the casing-side electrode was disposed were sandwiched between two cooling plates (made of CuMo) having high thermal conductivity, and the semiconductor element was pressurized. Cooling blocks were attached to the surfaces of the cooling plates opposite from the sides at which the semiconductor element 36' was disposed and were fixed with bolts and nuts so as to apply pressure to the semiconductor element 36', whereby the pressure-welded semiconductor device of Example 3 (hereinafter abbreviated as "the pressure-welded semiconductor device D") was obtained. The pressure-welded semiconductor device D has the same configuration as that of the pressure-welded semiconductor device 3 shown in FIG. 3.

The contact resistance and thermal resistance of the obtained pressure-welded semiconductor device D were evaluated while changing the pressure applied to the semiconductor element 36'. As a result, the electrical resistance and the thermal resistance both dropped in accompaniment with an increase in the pressure, and contact resistance and thermal resistance that were sufficient for practical use were shown when the pressure was 90 kPa or higher (load of 1 kg or more).

(Evaluation Method)

The contact resistance and the thermal resistance in the examples and the comparative example were determined by the method described below.

Contact Resistance

The contact resistance of the pressure-welded semiconductor devices manufactured in the examples and the comparative example was determined by measuring (1) the electrical resistance of the pressure-welded semiconductor devices manufactured in the examples and the comparative example and (2) the electrical resistance of the semiconductor devices of the same pressure-welded semiconductor devices where the pressure-welded portions between the casing-side electrode and the element-side electrodes were connected with solder, and then calculating the difference between the two.

It should be noted that contact resistance can be determined by calculating the difference between the two because a rise in voltage resulting from the contact resistance of the semiconductor element 36' can be ignored in the case of the electrical resistance (2) with respect to the fact that voltage resulting from ON resistance of the semiconductor element 36' and a rise in voltage resulting from contact resistance are included in the electrical resistance (1).

The measurement of the electrical resistances (1) and (2) were conducted by measuring ON voltage in a case where a High-Power Curve Tracer 371A manufactured by Sony Tektronix was used to apply a gate voltage of 15 V and introduce a collector current of 200 A.

Thermal Resistance

A water-cooling block (height: 35 cm; width: 40 cm; breadth: 7 cm) manufactured with an aluminum plate (thickness: about 5 mm) was connected to a constant temperature bath via a pump so that cooling water could be circulated therebetween, and the cooling water was circulated while the temperature of the cooling water was held at 65° C.

Next, the pressure-welded semiconductor devices manufactured in the examples and the comparative example were fixed on the water-cooling block, and the power voltage and the gate voltage were adjusted so that the power consumed by the semiconductor elements 36' was 80 W. A thermocouple was fixed to the semiconductor elements 36' in this state, the temperature thereof was measured, and the difference between the temperatures of the semiconductor elements 36' and the temperature of the cooling water (65° C.) was divided by the power consumed by the semiconductor elements 36', whereby the thermal resistance was determined.

As described above, according to the present invention, a pressure-welded semiconductor device can be provided in which electrical resistance and thermal resistance at pressure-welded portions between element-side electrodes and casing-side electrodes are small, even when a pressurizing force applied to a semiconductor element is small.

What is claimed is:

1. A pressure-welded semiconductor device comprising:
    at least one semiconductor element including a first main surface having disposed thereon at least one element-side electrode and a second main surface being opposite from the first main surface and having disposed thereon at least one element-side electrode;
    a casing including a first casing plate and a second casing plate disposed so as to face each other, with a first casing-side electrode being disposed on an opposing surface of the first casing plate and a second casing-side electrode being disposed on an opposing surface of the second casing plate, the at least one semiconductor element being incorporated inside the casing so that the first casing-side electrode and the at least one element-side electrode disposed on the first main surface are pressure-welded and the second casing-side electrode and the at least one element-side electrode disposed on the second main surface are pressure-welded; and
    a buffer conductive layer including conductive carbons disposed at at least one of a pressure-welded portion between the first casing-side electrode and the element-side electrode disposed on the first main surface and a pressure-welded portion between the second casing-side electrode and the element-side electrode disposed on the second main surface.

2. The pressure-welded semiconductor device of claim 1, wherein the conductive carbons are linear carbon structures.

3. The pressure-welded semiconductor device of claim 1, wherein the conductive carbons are carbon nanotubes.

4. The pressure-welded semiconductor device of claim 3, wherein the carbon nanotubes are substantially oriented in a thickness direction of the buffer conductive layer.

5. The pressure-welded semiconductor device of claim 1, wherein the buffer conductive layer is disposed so as to be tightly adhered to at least one of a surface of the at least one element-side electrode disposed on the first main surface forming a pressure-welded portion with the first casing-side electrode and a surface of the at least one element-side electrode disposed on the second main surface forming a pressure-welded portion with the second casing-side electrode.

6. The pressure-welded semiconductor device of claim 1, wherein the buffer conductive layer is disposed so as to be tightly adhered to at least one of a surface of the first casing-side electrode and a surface of the second casing-side electrode.

7. The pressure-welded semiconductor device of claim 1, wherein at least a pressure-welded surface of the at least one element-side electrode disposed on at least one of the first main surface and the second main surface includes a metal having a catalyst function which enables formation of a carbide.

8. The pressure-welded semiconductor device of claim 7, wherein the metal having the catalyst function which enables formation of a carbide includes at least one selected from Ni, Fe and Co.

9. The pressure-welded semiconductor device of claim 2, wherein both ends of the linear carbon structures are fixed at electrodes.

10. The pressure-welded semiconductor device of claim 2, wherein both ends of the linear carbon structures are carbidized and bonded to electrodes.

11. The pressure-welded semiconductor device of claim 2, wherein gaps between the linear carbon structures are filled with a filler member.

12. The pressure-welded semiconductor device of claim 11, wherein the filler member is at least one selected from the group consisting of metals, ceramics and organic materials.

13. The pressure-welded semiconductor device of claim 11, wherein at least one end of the linear carbon structures is carbidized and bonded to an electrode.

14. A method of manufacturing a pressure-welded semiconductor device comprising the steps of:
    preparing at least one semiconductor element including a first main surface having disposed thereon at least one element-side electrode and a second main surface being opposite from the first main surface and having disposed thereon at least one element-side electrode;
    forming linear carbon structures on the at least one semiconductor element; and
    sandwiching and pressure-welding, with two casing plates having an electrode respectively disposed on surfaces thereof, the at least one semiconductor element having formed thereon the linear carbon structures.

15. The method of manufacturing a pressure-welded semiconductor device of claim 14, wherein the linear carbon structures are formed on the at least one semiconductor element using vapor phase deposition.

16. The method of manufacturing a pressure-welded semiconductor device of claim 14, wherein the linear carbon structures are formed on the at least one semiconductor element using a paste that includes conductive carbons.

17. The method of manufacturing a pressure-welded semiconductor device of claim 14, further including the step of filling gaps between the linear carbon structures with a filler member.

18. The method of manufacturing a pressure-welded semiconductor device of claim 14, further including the step of carbidizing at least one end of the linear carbon structure and bonding it to an electrode.

* * * * *